United States Patent
Wu et al.

(10) Patent No.: US 7,714,673 B2
(45) Date of Patent: May 11, 2010

(54) CONTROL METHOD FOR OPERATION MODES OF OSCILLATOR AND THE APPARATUS THEREOF

(75) Inventors: Jia-Hsuan Wu, Hsinchu (TW); Cheng-Mu Wu, Hsinchu (TW)

(73) Assignee: Holtek Semiconductor Inc., Hsinchu (TW)

( * ) Notice: Subject to any disclaimer, the term of this patent is extended or adjusted under 35 U.S.C. 154(b) by 28 days.

(21) Appl. No.: 12/175,564

(22) Filed: Jul. 18, 2008

(65) Prior Publication Data

US 2009/0322434 A1    Dec. 31, 2009

(30) Foreign Application Priority Data

Jun. 27, 2008  (TW) ............................... 97124366 A

(51) Int. Cl.
*H03L 3/00* (2006.01)
*H03B 5/32* (2006.01)
*H03K 3/02* (2006.01)

(52) U.S. Cl. .................... 331/173; 331/55; 331/143; 331/158; 331/74; 327/298

(58) Field of Classification Search ............... 331/49, 331/46, 55, 56, 74, 143, 158, 44, 173; 327/298, 327/99, 291, 293, 294
See application file for complete search history.

(56) References Cited

U.S. PATENT DOCUMENTS

| | | | | |
|---|---|---|---|---|
| 5,369,377 A | * | 11/1994 | Benhamida | 331/49 |
| 5,483,185 A | * | 1/1996 | Scriber et al. | 327/99 |
| 6,194,940 B1 | * | 2/2001 | Hunter et al. | 327/298 |
| 7,102,391 B1 | * | 9/2006 | Sun et al. | 327/10 |

* cited by examiner

*Primary Examiner*—Robert Pascal
*Assistant Examiner*—Ryan J Johnson
(74) *Attorney, Agent, or Firm*—WPAT., P.C.; Justin King

(57) ABSTRACT

The present invention relates to a control method for the operation modes of an oscillator and the apparatus thereof, for which the method and the apparatus can be applied to the electronic circuits with multi-operation modes of the oscillator so as to correctly choose the desirable oscillator operation mode. Furthermore, an oscillator checking circuit sets up the oscillation mode automatically and judges if the oscillator operates properly. Hence, there is no need for the user to set up the oscillator operation mode manually.

10 Claims, 4 Drawing Sheets

CONTROL METHOD FOR OPERATION MODES OF OSCILLATOR AND THE APPARATUS THEREOF

BACKGROUND OF THE INVENTION

1. Field of the invention

The present invention relates to a control method for the operation modes of an oscillator and the apparatus thereof, more particularly to, an automatic control method for the operation modes of an oscillator and the apparatus thereof.

2. Description of the Related Art

Refer to FIG. 1, FIG. 1 illustrates the conventional logic circuit 10, and said circuit 10 comprising: an oscillator operation mode control circuit 101; an oscillator circuit 102; and an oscillating clock signal 103, wherein said oscillator circuit 102 is for receiving the control signal from said circuit 101, and the connection between said circuit 101 and said circuit 102 is built as an open loop.

FIGS. 1a, 1b, and 1c relates to a diagram for conventional oscillator operation mode control circuit and external oscillating signals, wherein for FIG. 1a, a quartz oscillator is connected onto the oscillator, for FIG. 1b, an external RC network is connected to the oscillator, and for FIG. 1c, an external square wave is inputted to the oscillator directly.

The user providing the desirable oscillator operation mode to said circuit 101, and via said circuit 101 the oscillator operation mode control signal was passed to said oscillator control circuit 102 so as to enable said oscillator 102 to start oscillating correctly and to output said signal 103.

Conventionally, there exists a demand for the multi-mode oscillator to setting the parameter by user to choose the desirable oscillator operation mode, wherein the parameter setting must be restored in the electronic circuit. Hereby we make examples to explain the parameter settings restored in different positions as follows:

If the setting parameters for the oscillator operation mode were restored in the electronic circuit device for which the memory cannot be modified right after manufacturing such as ROM (Read-Only Memory), then under this circumstance the inventory must be kept separately for the products with identical circuit function but merely different in oscillator operation modes, and the user cannot arbitrarily change the operation mode of said oscillator.

If the setting parameters for oscillator operation mode were restored in the EPROM (Erasable Programmable ROM) when the user write the oscillator operation mode into said EPROM and other program codes remain unchanged, then the oscillator operation mode for unpackaged chips is usually changed by the application of the ultraviolet light to erase the information restored in the EPROM and to write new oscillator operation mode into EPROM again; however, if the chips were already packaged then the packages outside the chips must be taken away, then the ultraviolet light is inevitably applied to erase the information in the EPROM. Such a process is a waste of time and not economic.

If the setting parameters for oscillator operation mode were restored in the EEPROM or Flash Memory, the user can burn the program on said memory to modify the setting parameters, however, if there is exceeding quantity of the parameters, then much additional effort will be needed.

If the setting parameters for oscillator operation mode were restored in the register inside the chip, then the users need to know how to choose the desirable setting parameters via the firmware or other approach.

Accordingly, in view of the above drawbacks, it is an imperative that an improved oscillator, particularly a control method for automatically choosing multi-mode oscillator and the apparatus is designed so as to solve the drawbacks as the aforementioned process to set up the parameters. By the disclosures of the present invention, the user can set up the operation mode of an oscillator rather than manually, for which not only the user's inconvenience can be saved but the manufacturing cost can be saved as well.

SUMMARY OF THE INVENTION

In view of the disadvantages of prior art, the primary object of the present invention relates to an automatic control method for the operation modes of an oscillator and the apparatus thereof, by the application of the logic circuits, to achieve the goal for which user can automatically set up the oscillator operation mode rather than manually.

The automatic control method for the operation modes of an oscillator comprising: providing an oscillator; providing an oscillator operation mode control circuit; connecting said oscillator and said oscillator operation mode control circuit so as to form a close loop between said oscillator and said circuit; and activating and initializing said oscillator.

The oscillator operation mode control circuit is not previously informed the desirable oscillator operation mode, hence, the control circuit will arbitrarily choose one of the operation modes of the oscillator, and then output the corresponding operation mode to the oscillator, and after oscillator circuit receive the control signal it will judge if the oscillating clock signal is correct and meets the expectation.

If the expectation is met, then judge it as the desirable operation mode, and maintain in the oscillator operation mode; if the expectation is not met, remove the currently chosen oscillator operation mode and choose one of the remaining oscillator operation mode and then output the operation mode to the oscillator and this step is repeated until the correct oscillator operation mode is chosen, wherein said oscillator comprises three operation modes such as a crystal oscillating mode, a RC oscillating mode, and an external clock mode.

Preferably, said logic circuits comprising: an oscillator; an oscillator operation mode control circuit; wherein said oscillator and said control circuit are connected so as to form a closed loop;

Preferably, said control circuit further comprises a plurality of Flip-Flops;

Preferably, said Flip-Flops are T Flip-Flops;

Preferably, said control circuit further comprises a slow RC oscillator;

Preferably, said control circuit further comprises a power-on reset circuit; and Preferably, said control circuit further comprises a finite state machine.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become readily understood from the detailed description given herein below and the accompanying drawings which are given by way of illustration only, and thus are not limitative of the present invention and wherein.

DESCRIPTION OF THE EXEMPLARY EMBODIMENTS

The following descriptions are of exemplary embodiments only, and are not intended to limit the scope, applicability, or configuration of the invention in any way. Rather, the following description provides a convenient illustration for implementing exemplary embodiments of the invention. Various changes to the described embodiments may be made in the function and arrangement of the elements described. For your esteemed members of reviewing committee to further understand and recognize the fulfilled functions and structural characteristics of the invention, several exemplary embodiments cooperating with detailed description are presented as the follows.

Figure 1:
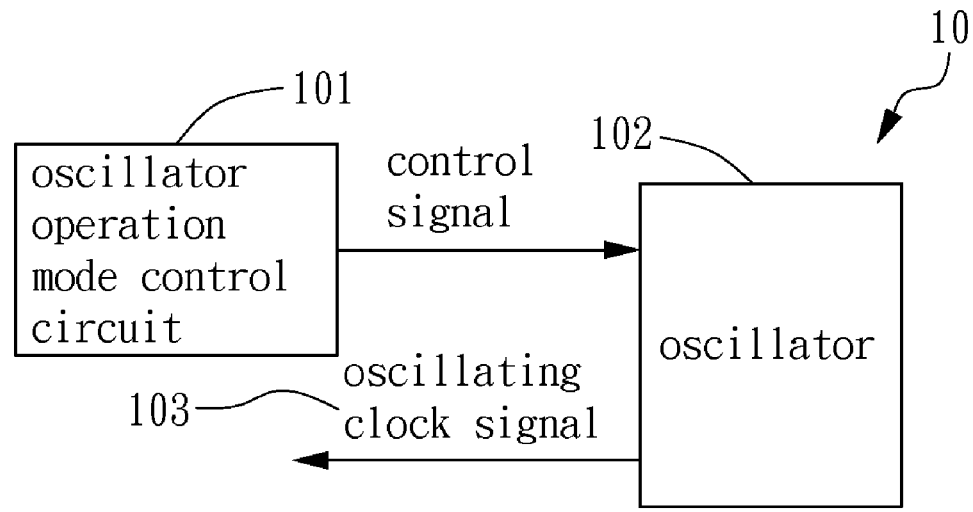
FIG. 1 relates to a diagram of the example of the prior art.
Figure 2:
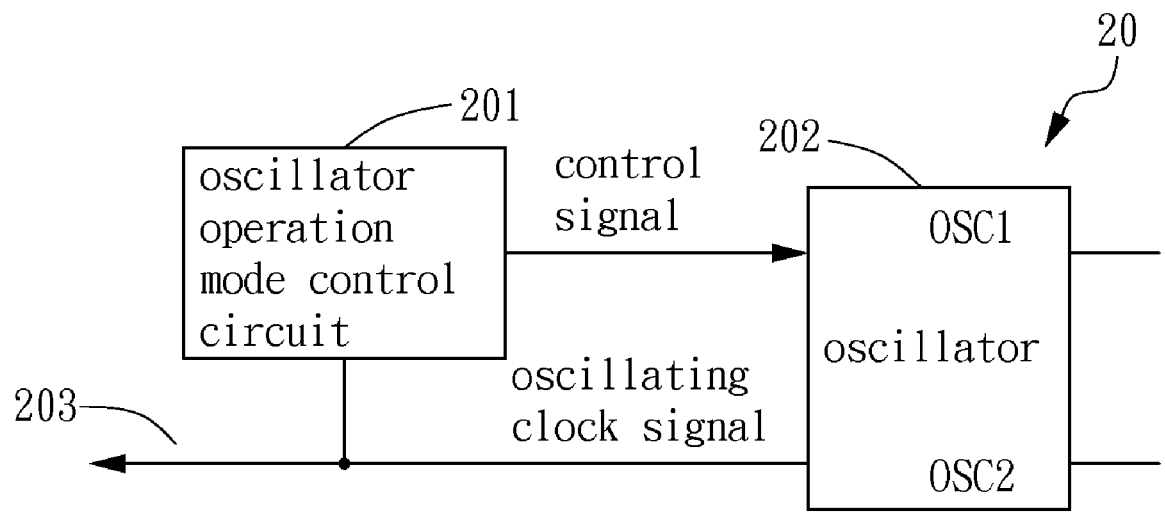
FIG. 2 relates to a view of a preferred embodiment according to the present invention.
Figure 1A:
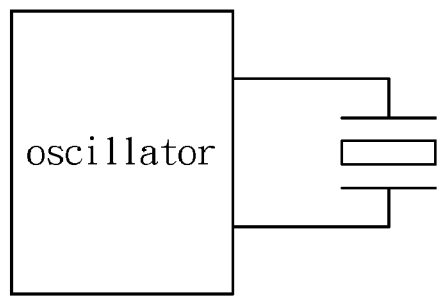
FIG. 1a relates to a diagram of the example of the prior art.
Figure 1B:
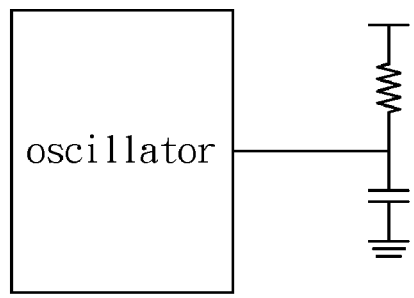
FIG. 1b relates to a diagram of the example of the prior art.
Figure 1C:
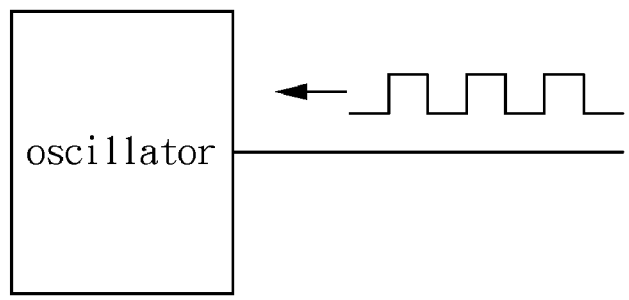
FIG. 1c relates to a diagram of the example of the prior art.

FIG. 2 relates to a view of a preferred embodiment according to the present invention. The logic circuit 20 comprises: an oscillator operation mode control circuit 201; and an oscillator circuit 202; wherein said control circuit 201 and oscillator 202 are mutually connected as forming a closed loop.

Said oscillator can be operated under a plurality of operation modes, wherein said operation modes comprises a plurality of operation modes such as an crystal oscillating mode, a RC oscillating mode, and external clock mode. In the crystal oscillating mode, there must be connected a crystal oscillator between one input terminal OSC1 and another input terminal OSC2; in the RC oscillating mode, either in OSC1 or OSC2 a RC network formed by a resistor and a capacitor; and in external clock mode, a clock signal must be installed onto said OSC1 or said OSC2.

Preferably, if said oscillator setting up at the wrong mode, then the oscillating clock signal will be remained at a fixed level to avoid other circuits using the same incorrectly functioning.

Figure 3:
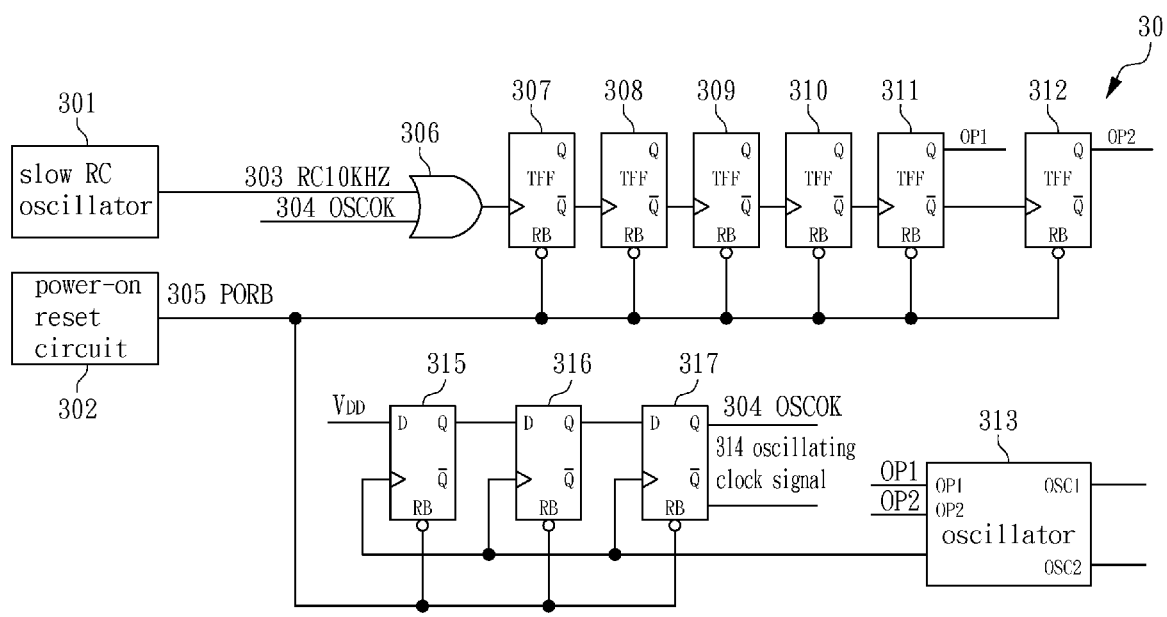
FIG. 3 relates to another view of a preferred embodiment according to the present invention.

Referring to FIG. 3, inside said control circuit 201 there is embedded a slow RC oscillator 301 which can self-oscillating with the power supply, for generating a 10 KHz square wave signal 303; inside said control circuit 201 there is further embedded a power-on reset circuit 302, at the time of power activation, output signal 305 PORB is 0, and maintained a short while it turns to be 1 so as to initialize the circuit.

306 is an OR gate, and 307~312 are T Flip-Flops which constitutes a counter. 315~317 are D Flip-Flops. 313 is an oscillator, which is identical to the same 202 in FIG. 2. 313 also uses terminals OP1, OP2 as decision for the operation modes. In the preferred embodiment of the present invention hereby we assume OP1=OP2=0 to be RC oscillating mode, OP1=1, OP2=0 to be external clock mode, and OP2=1 to be crystal oscillating mode.

The preferred embodiment of the present invention in FIG. 3 there is a slow RC oscillator 303 10 KHz to drive the counter made of a plurality of T Flip-Flops 307~312, and the output signal Q of T Flip-Flops 311 and 312 are directly connected to OP1 and OP2 of the oscillator to choose the operation mode of the oscillator. Therefore, at the beginning of power activation and the initialization by the power-on reset circuit, OP1=OP2=0 and at this moment the oscillator 313 is operating at the RC oscillating mode.

If the OSC1 and OSC2 of said oscillator 313 are not connected to a RC network implemented by a capacitor and a resistor to start oscillating, then OSCOK signal will be turned to 1 after three oscillating clock signal 314, and the output signal 303 of the slow RC oscillator 301 will be blocked by OR gate 306, meanwhile, T Flip-Flops 307~312 will maintain their values, which stands for the signals OP1 and OP2 will be locked so as to maintain the oscillator operating correctly.

In the contrary, if the OSC1 and OSC2 of said oscillator 313 were connected to a RC network, then the signal OSCOK is 0 since the oscillator 313 cannot start oscillating, and T Flip-Flops 307~312 will keep on counting, until OP=1, OP2=0. Meanwhile, the operation mode of the oscillator will be selected to be the external clock mode. If the user provides an external clock signal from either OSC1 or OSC2, then OSCOK will turn to be 1 after three periods of oscillating clock signal 314, and T Flip-Flops will stop counting, and the operation mode of the oscillator will remain in the external clock mode.

In the similar manner, if the oscillator is devoid of input clock, then OSCOK=0, T Flip-Flops 307~312 will keep on counting, until OP2=1 to enact the oscillator operating in the crystal oscillating mode. Meanwhile, if there is a crystal oscillator between OSC1 and OSC2, then after the oscillating clock signal 314 start oscillating, OSCOK=1, and said T Flip-Flops 307~312 will stop counting, and the operation mode of the oscillator will remain in the crystal oscillating mode; however, if there is no crystal oscillator between OSC1 and OSC2, then said T Flip-Flops 307~312 will keep on counting until all output signals Q of said T Flip-Flops to be all 1 and then the counter overflows, the initial mode OP1=0, OP2=0 will resume until the correct oscillator operation mode will be chosen.

Figure 4:
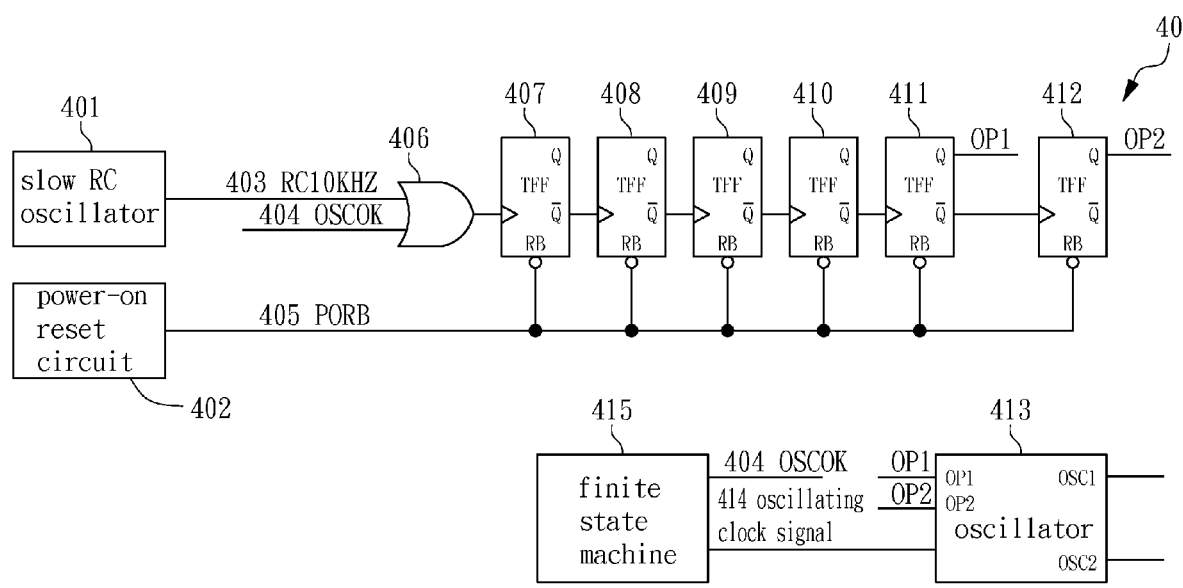
FIG. 4 relates to another view of a preferred embodiment according to the present invention.

In the present embodiment, in addition to 3 D Flip-Flops are used for judging if the oscillator start oscillating, a Finite State Machine 415 can also be applied for starting oscillating as illustrated in FIG. 4, the second preferred embodiment of the present invention. Said Finite State Machine can judge if the oscillator starts oscillating as well as if the oscillator 413 outputs a fixed period of the oscillating clock 414, and judge if the period can meet expectation to enhance the capability for the circuit to judge correct operation mode. Also, the preferred embodiment with Finite State Machine can prevent the interruption to OSCOK signal 304 at the time of said oscillating clock signal 314 having noise.

The disclosures of the present invention can be also applied to the oscillator in a micro-controller and for which can be anticipated by one skilled in the ordinary art without further mentioning.

The invention being thus aforesaid, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An apparatus for automatically controlling a plurality of operation modes of an oscillator and automatically switching the operation modes, comprising:
   a RC oscillator, for generating a first oscillated clock;
   a power-on reset circuit, for generating a reset signal;

a control logic gate, coupled to the RC oscillator, for receiving the first oscillated clock and a confirming signal, and outputting a drive signal according to the first oscillated clock and the confirming signal;

a plurality of T flip flops, coupled to the control logic gate, for receiving the drive signal and generating at least one option signal;

a multi-mode oscillator, coupled to the T flip flops, having at least two input terminals for the plurality of operation modes, for receiving the at least one option signal and generating a second oscillated clock according to the option signal; and a finite state machine, coupled to the multi-mode oscillator and the control logic gate, for receiving the second oscillated clock and generating the confirming signal according to the received second oscillated clock.

2. The apparatus as recited in claim 1, wherein the control logic gate is an OR gate.

3. The apparatus as recited in claim 1, wherein the multi-mode oscillator is further coupled to a RC network.

4. The apparatus as recited in claim 1, wherein the multi-mode oscillator is further coupled to a crystal.

5. The apparatus as recited in claim 1, wherein the multi-mode oscillator is further coupled to an external clock.

6. An apparatus for automatically controlling a plurality of operation modes of an oscillator and switching the operation modes, comprising:

a RC oscillator, for generating a first oscillated clock;

a power-on reset circuit, for generating a reset signal;

a control logic gate, coupled to the RC oscillator, for receiving the first oscillated clock and a confirming signal, and outputting a drive signal according to the first oscillated clock and the confirming signal;

a plurality of T flip flops, coupled to the control logic gate, for receiving the drive signal and generating at least one option signal;

a multi-mode oscillator, coupled to the T flip flops, having at least two input terminals for the plurality of operation modes, for receiving the at least one option signal and generating a second oscillated clock according to the option signal; and a plurality of D flip flops, coupled to the multi-mode oscillator and the control logic gate, for receiving the second oscillated clock at their clock inputs and generating the confirming signal according to the received second oscillated clock, wherein one of the D flip flops has a D input coupled to logic high or $V_{DD}$.

7. The apparatus as recited in claim 6, wherein the control logic gate is an OR gate.

8. The apparatus as recited in claim 6, wherein the multi-mode oscillator is further coupled to a RC network.

9. The apparatus as recited in claim 6, wherein the multi-mode oscillator is further coupled to a crystal.

10. The apparatus as recited in claim 6, wherein the multi-mode oscillator is further coupled to an external clock.

* * * * *